US009437836B2

(12) United States Patent
Wang et al.

(10) Patent No.: US 9,437,836 B2
(45) Date of Patent: Sep. 6, 2016

(54) METHOD FOR IMPROVING THE REFLECTIVITY OF ALUMINUM IN OLED STRUCTURE

(71) Applicant: EverDisplay Optronics (Shanghai) Limited, Shanghai (CN)

(72) Inventors: Chenghsien Wang, Shanghai (CN); Chihhong Liu, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 25 days.

(21) Appl. No.: 14/155,026

(22) Filed: Jan. 14, 2014

(65) Prior Publication Data
US 2014/0295596 A1    Oct. 2, 2014

(30) Foreign Application Priority Data

Mar. 27, 2013 (CN) .......................... 2013 1 0103197

(51) Int. Cl.
*H01L 51/52* (2006.01)

(52) U.S. Cl.
CPC ................................ *H01L 51/5218* (2013.01)

(58) Field of Classification Search
CPC ............. H01L 51/5218; H01L 438/29; H01L 33/10–33/508
USPC ........................................................ 438/29
See application file for complete search history.

(56) References Cited

U.S. PATENT DOCUMENTS

| 4,289,574 A * | 9/1981 | Radigan et al. .............. 438/669 |
| 7,109,652 B2 | 9/2006 | Tsai et al. |
| 7,675,064 B2 | 3/2010 | Lee |
| 2007/0116983 A1 | 5/2007 | Kanno et al. |
| 2010/0301368 A1 | 12/2010 | Im et al. |

* cited by examiner

*Primary Examiner* — William F Kraig
*Assistant Examiner* — Stanetta Isaac
(74) *Attorney, Agent, or Firm* — Andrew F. Yound, Esq.; Lackenbach Siegel, LLP

(57) ABSTRACT

The present disclosure discloses a method for improving the reflectivity of aluminum in OLED structure. The OLED structure includes a top ITO layer, a middle reflective layer made by aluminum and a bottom ITO layer. The method comprises; forming a bottom ITO layer; coating the aluminous reflective layer on the surface of the bottom ITO layer and forming an aluminum oxide layer on the surface of the aluminous reflective layer uniformly by introducing plenty of oxygen gas simultaneously; adjusting the velocity of coating the aluminous reflective until the aluminum oxide layer is formed; and forming an top ITO layer on the surface of the aluminum oxide layer. The present disclosure can repair and cover the defects on the surface of the metal aluminum film and can reduce the concavities and hillocks on the surface of the metal aluminum film. Consequently, the reflectivity of aluminum in OLED structure is improved.

18 Claims, 3 Drawing Sheets

METHOD FOR IMPROVING THE REFLECTIVITY OF ALUMINUM IN OLED STRUCTURE

CROSS-REFERENCE TO RELATED APPLICATIONS

The present application claims priority to and the benefit of Chinese Patent Application No. CN201310103197.7, filed on Mar. 27, 2013, the entire content of which is incorporated herein by reference.

BACKGROUND OF THE INVENTION

1. Field of the Invention

The present disclosure relates to the technical field of OLED manufacturing process, more specifically, to a method for improving the reflectivity of aluminum in OLED structure.

2. Description of the Related Art

In the technical field of OLED manufacturing process, the OLED is generally with the "sandwich" structure whose anode and cathode are respectively the ITO transparent electrode and the metal electrode. Driven by a certain voltage, electrons and holes are injected into the electron transport layer and the hole transport layer from the cathode and the anode respectively. Electrons and holes are transported to the light emitting layer through the electron transport layer and the hole transport layer respectively. Furthermore, the electrons and the holes meet with each other in the light emitting layer to form excitons. The excitons excite the light emitting molecules, thus the light emitting molecules emit the visible light after being radiated and relaxed. As shown in FIG. 1, generally, the "sandwich" structure of the anode of OLED is composed of a Top Layer 1, a Middle Layer 2 and a Bottom Layer 3. Top Layer 1 is covered by Top-ITO and acts as the anode of OLED. Middle Layer 2 adopts Ag as the reflective materials. Bottom Layer 3 is Bottom-ITO which acts as the contact material of the IC pad. The process machine is operated in the sputter coating mode.

In consideration of the oxidation characteristic of Ag material, it is necessary to divide Bottom-ITO and Ag/Top-ITO into two layers to define the pattern of the pixel area and the driver area individually. Besides, high reflectivity of Ag makes the processing of OLED color-adjustment be controllable. As shown in FIG. 2, as the oxidability of Ag is strong, the corrosivity is strong, it is easy to cause the concavities and hillocks, indicated as the white hollow triangles in the figure, on the surface of the metal layer, i.e., Middle Layer 2. The concavities and the hillocks will lead to a rough surface of the film and a poor quality of the film. However, the cost for using Ag as the target materials is 2 to 3 times higher than using Al, which increases the cost of manufacture. With respect to the metal Al, although the reflectivity of Al, lower or equal to 90%, is lower than Ag, the processing of Al is mature and it is already widely used in TFT-LTPS processing.

A related art has disclosed a top emission organic light emitting display with a reflective layer therein. The reflective layer, a first electrode, an organic layer and a transparent second electrode are subsequently formed on the substrate. When a bias voltage is applied to the first electrode and the transparent second electrode, the organic layer emits radiation. The reflective layer reflects radiation from the organic layer toward the transparent second electrode, and therefore the emission efficiency of the OLED increases.

Another related art has disclosed a self-illumination display, including a first substrate, a light-absorbing structure, a filter layer, a driving circuit unit and a self-illumination unit. The light-absorbing structure and the filter layer are disposed over the first substrate. The driving circuit unit is disposed over and shielded by the light-absorbing structure. The self-illumination unit is disposed over the filter layer, including a light-transmissible electrode, a light emitting layer and a black electrode. The self-illumination unit is disposed over the filter layer, including a light-transmissible electrode, a light emitting layer and a black electrode. The light-transmissible electrode is disposed over the filter layer while the light emitting layer and the black electrode are sequentially tiered on the light-transmissible electrode. The light-absorbing structure, the filter layer and the black electrode together reduce the reflection of the ambient light and enhance the image contrast. Consequently, it did not solve the problem that the concavities and hillocks will be formed on the surface of the metal aluminum film and reduce the reflectivity thereof

SUMMARY OF THE INVENTION

An embodiment of the present disclosure is directed toward a method for improving the reflectivity of aluminum in OLED structure capable of repairing and covering the defects on the surface of the metal aluminum film and reducing the concavities and hillocks on the surface of the metal aluminum film.

A method for improving the reflectivity of aluminum in OLED structure, comprising: forming a bottom ITO layer; coating an aluminous reflective layer on a surface of the bottom ITO layer and forming an aluminum oxide layer on a surface of the aluminous reflective layer uniformly by introducing plenty of oxygen gas simultaneously; and forming a top ITO layer on a surface of the aluminum oxide layer.

According to one embodiment of the present disclosure, wherein the aluminum oxide layer has a thickness ranging from 5 nm to 50 nm.

According to one embodiment of the present disclosure, wherein coating velocity and refractive index of the aluminum oxide layer of the aluminum oxide layer are adjusted by adjusting power, temperature and flow velocity of the oxygen gas simultaneously.

According to one embodiment of the present disclosure, wherein the coating velocity and refractive index of the aluminum oxide layer are adjusted by adjusting power and temperature simultaneously.

According to one embodiment of the present disclosure, wherein the coating velocity and refractive index of the aluminum oxide layer are adjusted by adjusting power and flow velocity of the oxygen gas simultaneously.

According to one embodiment of the present disclosure, wherein the coating velocity and refractive index of the aluminum oxide layer are adjusted by adjusting temperature and flow velocity of the oxygen gas simultaneously.

According to one embodiment of the present disclosure, wherein the coating velocity of the aluminum oxide layer ranges from 5 Å/s to 10 Å/s.

According to one embodiment of the present disclosure, wherein the coating velocity of the aluminum oxide layer ranges from 5 Å/s to 10 Å/s.

According to one embodiment of the present disclosure, wherein the coating velocity of the aluminum oxide layer ranges from 5 Å/s to 10 Å/s.

According to one embodiment of the present disclosure, wherein the coating velocity of the aluminum oxide layer ranges from 5 Å/s to 10 Å/s.

According to one embodiment of the present disclosure, wherein the refractive index of the aluminum oxide layer ranges from 1.7 to 1.8.

According to one embodiment of the present disclosure, wherein the refractive index of the aluminum oxide layer ranges from 1.7 to 1.8.

According to one embodiment of the present disclosure, wherein the refractive index of the aluminum oxide layer ranges from 1.7 to 1.8.

According to one embodiment of the present disclosure, wherein the refractive index of the aluminum oxide layer ranges from 1.7 to 1.8.

According to one embodiment of the present disclosure, wherein thickness of the aluminous reflective layer is 2000 Å.

According to one embodiment of the present disclosure, wherein thickness of the aluminous reflective layer is 2000 Å.

According to one embodiment of the present disclosure, wherein thickness of the aluminous reflective layer is 2000 Å.

According to one embodiment of the present disclosure, wherein thickness of the aluminous reflective layer is 2000 Å.

According to one embodiment of the present disclosure, wherein sputter coating is adopted in the process of coating.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTION

Figure 1:
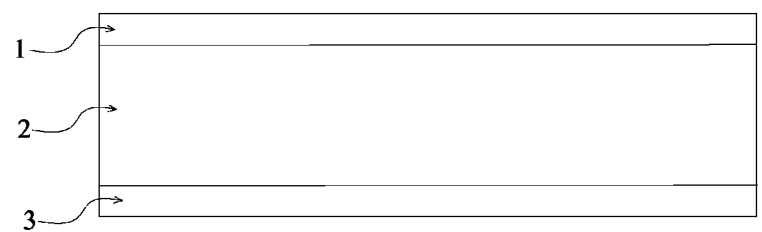
FIG. 1 shows a structure diagram of the anode of OLED structure in the related art.
Figure 2:
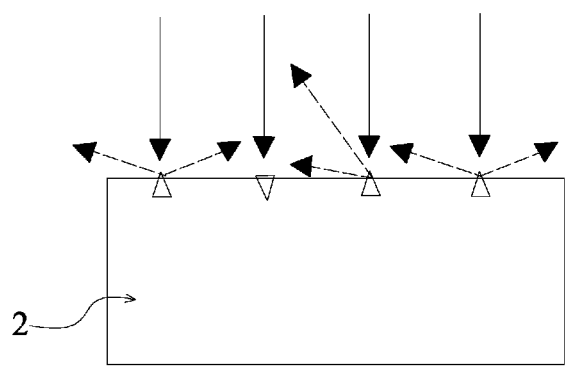
FIG. 2 shows a simulation diagram of the incident light, the reflected light and the refracted light on the surface of the OLED middle reflective layer in the related art.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Figure 3:
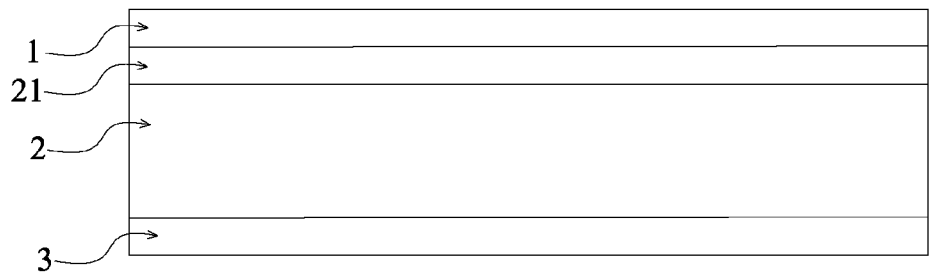
FIG. 3 shows a structure diagram of the OLED structure formed by the method of the present disclosure.

As shown in FIG. 3, according to the method of the present disclosure, the anode of the OLED structure includes a Top ITO Layer 1, a Middle Reflective Layer 2 and a Bottom ITO Layer 3. Middle Reflective Layer 2 is an aluminous reflective layer.

An aluminous reflective layer is coated on the surface of Bottom ITO layer 3, i.e., Middle Reflective Layer 2. At the same time, plenty of oxygen gas is introduced onto Middle Reflective Layer 2 to form an Aluminum Oxide Layer 21 uniformly on the surface of Middle Reflective Layer 2, i.e., the aluminous reflective layer. The surface of Aluminum Oxide Layer 21 is smooth and flat.

Figure 4:
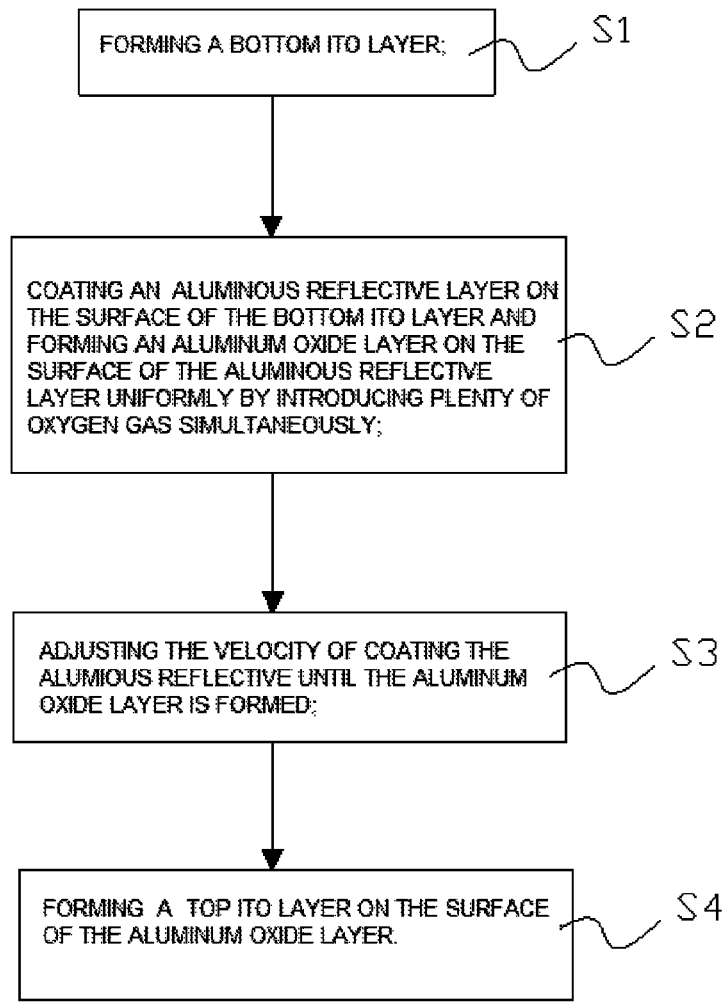
FIG. 4 is a flow chart of the method in the present disclosure.

As shown in FIG. 4, the method for improving the reflectivity of aluminum in OLED structure in the present disclosure includes the following steps:

S1, forming a Bottom ITO Layer 3;

S2, coating an Aluminous Reflective Layer 2 on the upper surface of Bottom ITO Layer 3 and forming an Aluminum Oxide Layer 21 uniformly on the face of Aluminous Reflective Layer 2 by introduce the plenty of oxygen gas;

S3, adjusting the velocity of coating Aluminous Reflective Layer 2 until Aluminum Oxide Layer 21 is formed;

S4, forming a Top ITO Layer 1 on the surface of Aluminum Oxide Layer 21.

In a preferred embodiment of the present disclosure, the thickness of Middle Reflective Layer 2 is 2000 Å, and the thickness of Aluminum Oxide layer ranges form 5 nm to 50 nm. In order to produce Aluminum Oxide Layer 21 in accordance with the said requirements, the velocity of coating Aluminum Oxide Layer 21 may be adjusted by adjusting the power, the temperature and the flow rate of the oxygen gas simultaneously, or adjusted by adjusting the power and the temperature simultaneously, or adjusted by adjusting the power and the flow rate of the oxygen gas simultaneously, or adjusted by adjusting the temperature and the flow rate of the oxygen gas.

What should be indicated is that the velocity of coating Aluminous Reflective Layer 2 preferably ranges from 5 Å/s to 10 Å/s; the refractive index of Aluminum Oxide Layer 21 preferably ranges from 1.7 to 1.8; and Aluminum Oxide Layer 21 and Aluminous Reflective Layer 2 are preferably coated by sputter coating.

Figure 5:
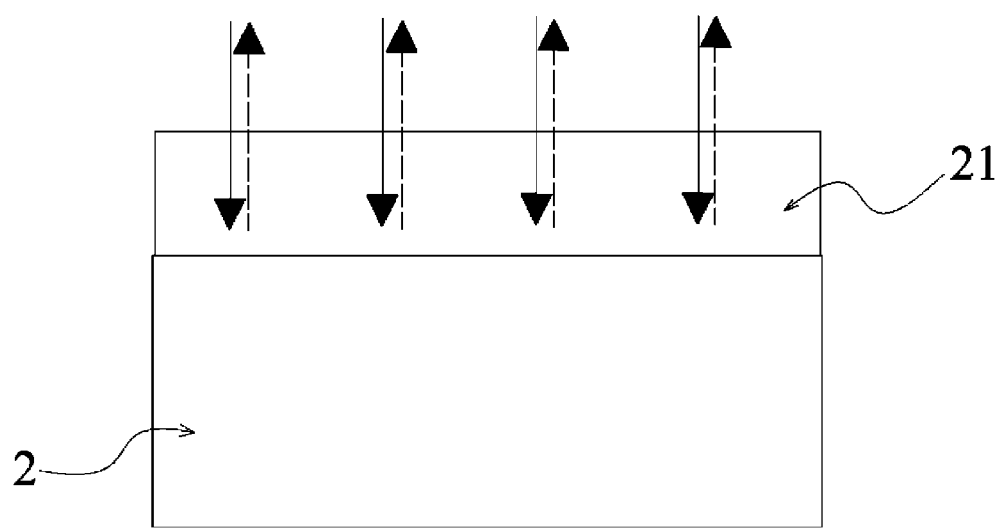
FIG. 5 is a simulation diagram of forming the ideal incident light and the ideal reflected light on the surface of the middle reflective layer coated with the aluminum oxide by the method of the present disclosure.

According to Thin Film Optical Theory which is based on Admittance loci, the reflectivity R of the vertical incident light on the surface of the aluminum oxide layer depends on the thickness d of the aluminum oxide layer, the optical extinction coefficient k and the index of refraction n of the film. Since the light field intensity will attenuate exponentially with the distance of the light moving in the film, the optical extinction coefficient k is related. As shown in FIG. 5, the calculation formula of the reflectivity R of the vertical incident light (mainly are the visible lights with the wavelengths ranging from 450 nm to 680 nm) on the surface of the Aluminum Oxide Layer 21 is that as follows:

$$R = \left|\frac{1-(n-ik)}{1+(n-ik)}\right|^2 = \frac{(1-n)^2 + k^2}{(1+n)^2 + k^2} \quad (1)$$

In Formula (1), n-ik represents the Admittance of the metal thin film, where the Admittance is the admittance of the aluminum oxide thin film. The Admittance is the ratio (Y=H/E) of the magnetic field (H) of the electromagnetic wave and the electric field (E) in the system.

$$\begin{bmatrix} E \\ H \end{bmatrix} = \begin{bmatrix} \cos\delta_f & i(\sin\delta_f/\eta_f) \\ i\eta_f \sin\delta_f & \cos\delta_f \end{bmatrix} \begin{bmatrix} 1 \\ \alpha - i\beta \end{bmatrix} \quad (2)$$

The Formula (2) represents the characteristics of the metal thin film, which is called Characteristic Matrix of Thin Film or Matrix of Film for short. In the above formula, $\alpha - i\beta$ represents the Admittance of the metal thin film; $\delta f = 2\pi Df/\lambda 0$ is the phase thickness of Aluminum Oxide ($Al_2O_3$) Layer; the phase thickness is the phase difference between two adjacent reflected/refracted lights; nf is the admittance value (n=1.6) of the aluminum oxide. The above parameters are substituted into Formula (2) to calculate the admittance value of the metal film. Next, the admittance value of the metal film is substituted into Formula (1) to acquire the maximum reflectivity. Aluminum oxide is a kind of oxide film with relatively low refractive index, which ranks second only to the value of the silicon dioxide of 1.45. The results acquired from the experimental data are different due to the changes of the surface condition, the changes of the thickness and the characteristics of not being decomposed easily and the week scattering. Referring to FIG. 5, the existence of the aluminum oxide layer makes the refracted lights almost completely disappear, furthermore, the reflected lights and the incident lights are basically in the same line.

According to the experimental results, the reflectivity of an aluminum layer coated with the aluminum oxide thereon is 2% to 3% higher than that of a single aluminum layer. The above data is the application data in other fields. The data applied to displays is to be further verified by experiments in future.

In conclusion, the present disclosure can repair and cover the defects on the surface of the metal aluminum film and can reduce the concavities and hillocks on the surface of the metal aluminum film. Consequently, the reflectivity of aluminum is improved and the controllable characteristic of the OLED color-adjustment is also enhanced.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for improving the reflectivity of aluminum in OLED structure, comprising:
    (a) forming a bottom ITO layer;
    (b) coating an aluminous reflective layer on a surface of the bottom ITO layer and forming an aluminum oxide layer on a surface of the aluminous reflective layer uniformly by introducing oxygen gas simultaneously; and
    (c) forming a top ITO layer on a surface of the aluminum oxide layer;
    wherein, the aluminum oxide layer has a thickness ranging from 5 nm to 50 nm.

2. The method as claimed in claim 1, wherein coating velocity and refractive index of the aluminum oxide layer of the aluminum oxide layer are adjusted by adjusting power, temperature and flow velocity of the oxygen gas simultaneously.

3. The method as claimed in claim 2, wherein the coating velocity of the aluminum oxide layer ranges from 5 Å/s to 10 Å/s.

4. The method as claimed in claim 2, wherein the refractive index of the aluminum oxide layer ranges from 1.7 to 1.8.

5. The method as claimed in claim 4, wherein thickness of the aluminous reflective layer is 2000 Å.

6. The method as claimed in claim 1, wherein the coating velocity and refractive index of the aluminum oxide layer are adjusted by adjusting power and temperature simultaneously.

7. The method as claimed in claim 6, wherein the coating velocity of the aluminum oxide layer ranges from 5 Å/s to 10 Å/s.

8. The method as claimed in claim 6, wherein the refractive index of the aluminum oxide layer ranges from 1.7 to 1.8.

9. The method as claimed in claim 8, wherein thickness of the aluminous reflective layer is 2000 Å.

10. The method as claimed in claim 1, wherein the coating velocity and refractive index of the aluminum oxide layer are adjusted by adjusting power and flow velocity of the oxygen gas simultaneously.

11. The method as claimed in claim 10, wherein the coating velocity of the aluminum oxide layer ranges from 5 Å/s to 10Å/s.

12. The method as claimed in claim 10, wherein the refractive index of the aluminum oxide layer ranges from 1.7 to 1.8.

13. The method as claimed in claim 12, wherein thickness of the aluminous reflective layer is 2000 Å.

14. The method as claimed in Claim 1, wherein the coating velocity and refractive index of the aluminum oxide layer are adjusted by adjusting temperature and flow velocity of the oxygen gas simultaneously.

15. The method as claimed in claim 14, wherein the coating velocity of the aluminum oxide layer ranges from 5 Å/s to 10 Å/s.

16. The method as claimed in claim 14, wherein the refractive index of the aluminum oxide layer ranges from 1.7 to 1.8.

17. The method as claimed in claim 16, wherein thickness of the aluminous reflective layer is 2000 Å.

18. The method as claimed in claim 1, wherein sputter coating is adopted in the process of coating.

* * * * *